(12) United States Patent
Tatsumi

(10) Patent No.: US 11,489,240 B2
(45) Date of Patent: Nov. 1, 2022

(54) HIGH-FREQUENCY SWITCH CIRCUIT AND FRONT-END CIRCUIT INCLUDING SAME

(71) Applicant: SUMITOMO ELECTRIC INDUSTRIES, LTD., Osaka (JP)

(72) Inventor: Taizo Tatsumi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/221,450

(22) Filed: Apr. 2, 2021

(65) Prior Publication Data
US 2021/0320389 A1    Oct. 14, 2021

(30) Foreign Application Priority Data
Apr. 9, 2020  (JP) .............................. JP2020-070286

(51) Int. Cl.
*H03K 17/76* (2006.01)
*H01P 1/15* (2006.01)
*H04B 1/48* (2006.01)

(52) U.S. Cl.
CPC .............. *H01P 1/15* (2013.01); *H03K 17/76* (2013.01); *H04B 1/48* (2013.01)

(58) Field of Classification Search
CPC .... H04B 1/48; H04B 2001/485; H03K 17/76; H01P 1/15
See application file for complete search history.

(56) References Cited

U.S. PATENT DOCUMENTS

| | | | |
|---|---|---|---|
| 11,196,453 B2 * | 12/2021 | Moreschi | H03K 17/74 |
| 2004/0032706 A1 | 2/2004 | Kemmochi et al. | |
| 2007/0120619 A1 | 5/2007 | Kearns | |
| 2010/0279630 A1 * | 11/2010 | Brady | H04B 1/48 455/83 |

* cited by examiner

*Primary Examiner* — Patrick C Chen
(74) *Attorney, Agent, or Firm* — Smith, Gambrell & Russell, LLP.

(57) ABSTRACT

A high-frequency switch circuit includes a first switch configured to electrify or cut off connection between an antenna terminal and an input terminal, and a second switch configured to electrify or cut off connection between the antenna terminal and an output terminal. The first switch has a transmission line connecting the antenna terminal and the input terminal; a diode having an anode connected to a first node between the transmission line and the input terminal, and a cathode connected to a second node; and a capacitor connected to the second node and a first power supply voltage. A first control terminal is connected to the first node via a first resistor and a first inductor. The first switch further includes a charging/discharging circuit connected to a second power supply voltage and the first control terminal and charging and discharging the capacitor from the second node.

10 Claims, 15 Drawing Sheets

HIGH-FREQUENCY SWITCH CIRCUIT AND FRONT-END CIRCUIT INCLUDING SAME

TECHNICAL FIELD

The present disclosure relates to a high-frequency switch circuit and a front-end circuit including the same.

BACKGROUND

In recent years, a front-end circuit connecting an antenna and a device for transmitting and receiving to each other has been used for high-frequency wireless communication such as in a microwave band (a band of 6 to 90 GHz). A high-frequency switch circuit selectively connecting a terminal connected to the antenna and two input/output terminals to each other is built into this front-end circuit. For example, Patent Literature 1 (United States Patent No. 2004/0032706) and Patent Literature 2 (United States Patent No. 2007/0120619) disclose configurations of a high-frequency switch circuit which connects an antenna to a transmitting circuit and a receiving circuit and includes a transmission line and a diode.

In the high-frequency switch circuit in the related art described above, when an amplitude of a high-frequency signal input from the transmitting circuit side becomes relatively large, a distortion tends to occur in a high-frequency signal output to the antenna side. For this reason, it is desired to reduce a distortion in an output by a simple circuit configuration.

SUMMARY

According to an aspect of the present disclosure, there is provided a high-frequency switch circuit including an antenna terminal configured to be connected to an external antenna, an output terminal configured to output a high-frequency reception signal, an input terminal configured to input a high-frequency transmission signal, a first control terminal configured to input a first control signal, a second control terminal configured to input a second control signal, a first switch configured to electrify or cut off connection between the antenna terminal and the input terminal in accordance with the first control signal, and a second switch configured to electrify or cut off connection between the antenna terminal and the output terminal in accordance with the second control signal. The first switch has a transmission line connecting the antenna terminal and the input terminal to each other; a diode having an anode connected to a first node between the transmission line and the input terminal, and a cathode connected to a second node; and a capacitance element connected to the second node and a first power supply voltage. The first control terminal is connected to the first node via a first resistance element and a first inductor element connected in series. The first switch further includes a charging/discharging circuit connected to a second power supply voltage and the first control terminal and charging and discharging the capacitance element from the second node in accordance with the first control signal.

DETAILED DESCRIPTION

Hereinafter, an embodiment of the present disclosure will be described with reference to the drawings. In description of the drawings, the same reference signs are applied to the same elements, and duplicate description will be omitted.

Figure 1:
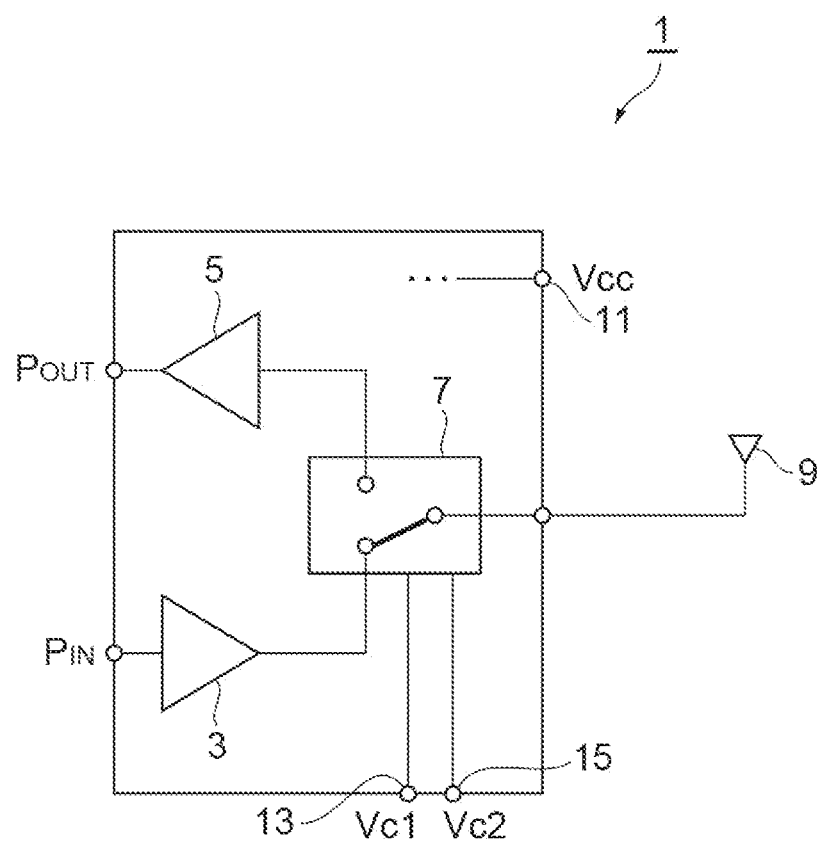
FIG. 1 is a block diagram illustrating a schematic configuration of a front-end circuit 1 according to an embodiment.

FIG. 1 is a block diagram illustrating a configuration of a front-end circuit 1 according to the embodiment. The front-end circuit 1 is used for wireless communication in a microwave band (a band of 6 to 90 GHz) and is used by being connected between an antenna element and a transmitting/receiving device for high-frequency communication. This front-end circuit 1 includes a transmission signal amplifier 3, a reception signal amplifier 5, and a high-frequency switch circuit 7. The transmission signal amplifier 3 is connected to an input terminal $P_{IN}$, receives a transmission signal having a fundamental wave component (for example, a frequency component of 30 GHz) modulated from the outside, amplifies the transmission signal, and inputs the amplified transmission signal to the high-frequency switch circuit 7. The high-frequency switch circuit 7 is a single-pole double-throw switch (SPDT) for exclusively switching between a function of transmitting a transmission signal output from the transmission signal amplifier 3 to an external antenna element 9, and a function of transmitting a reception signal input from the antenna element 9 to the reception signal amplifier 5. The reception signal amplifier 5 is connected to an output terminal $P_{OUT}$, amplifies a reception signal transmitted from the high-frequency switch circuit 7, and outputs the amplified reception signal to the outside. Moreover, the front-end circuit 1 includes a power supply port 11 supplying a power supply voltage Vcc to the inside of the circuit, and control ports 13 and 15 for respectively receiving two control signals Vc1 and Vc2 for controlling switching in the high-frequency switch circuit 7.

Next, with reference to FIGS. 2 to 4B, a configuration of the high-frequency switch circuit 7 will be described.

Figure 2:
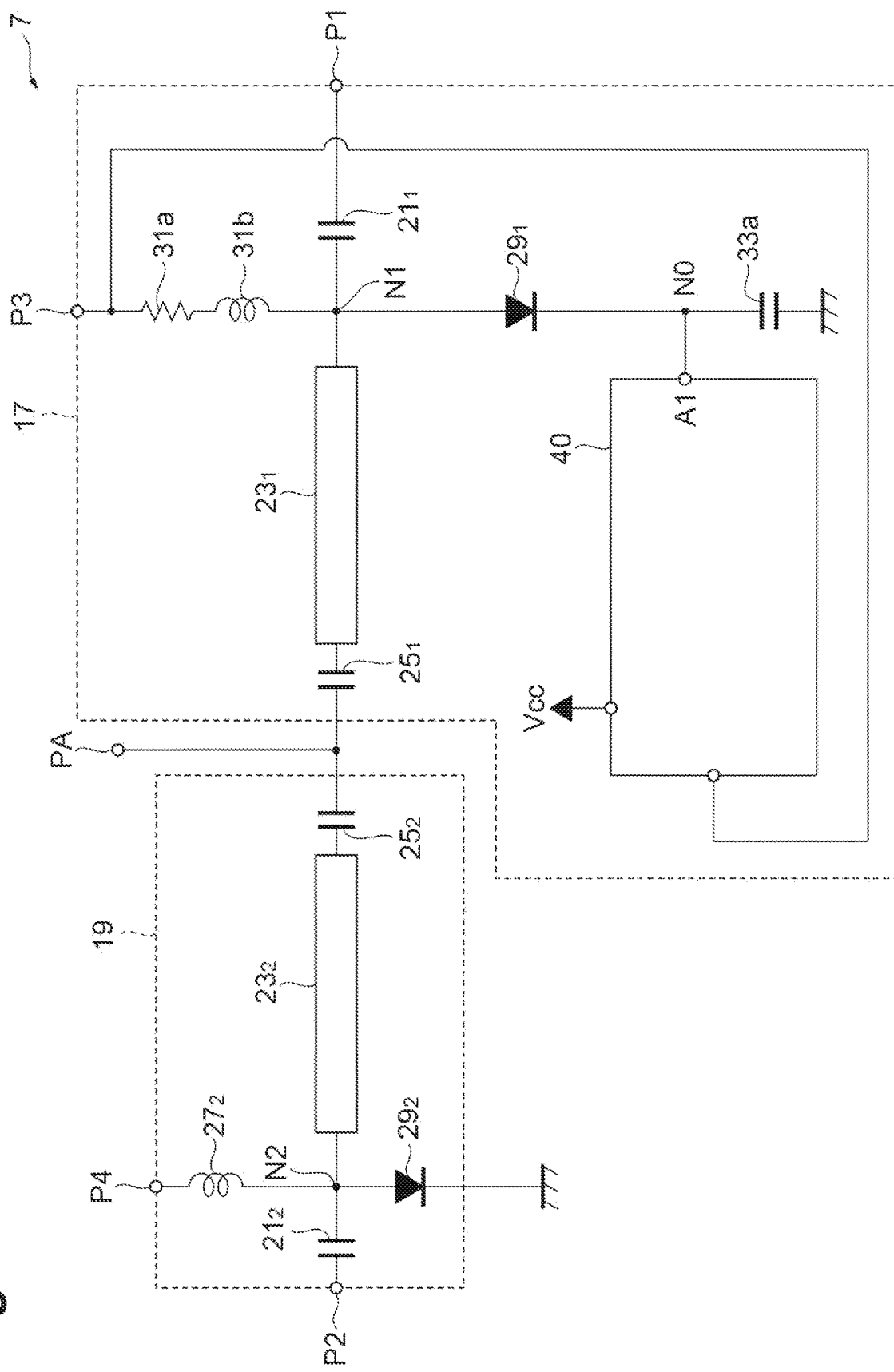
FIG. 2 is a block diagram illustrating a configuration of a high-frequency switch circuit 7 in FIG. 1.

FIG. 2 is a block diagram illustrating a configuration of the high-frequency switch circuit 7 in FIG. 1. The high-frequency switch circuit 7 includes an antenna port (antenna terminal) PA connected to the external antenna element 9, an input port (input terminal) P1 connected to the transmission signal amplifier 3 and inputting a transmission signal, an output port (output terminal) P2 connected to the reception signal amplifier 5 and outputting a reception signal, a control port (first control terminal) P3 inputting the control signal (first control signal) Vc1, a control port (second control terminal) P4 inputting the control signal (second control signal) Vc2, a switch circuit section (first switch) 17 electrifying or cutting off connection in a high-frequency signal range between the antenna port PA and the input port P1 in accordance with the control signal Vc1, and a switch circuit section (second switch) 19 electrifying or cutting off connection in a high-frequency signal range between the antenna port PA and the output port P2 in accordance with the control signal Vc2.

This high-frequency switch circuit 7 functions such that the switch circuit sections 17 and 19 are exclusively electrified or cut off by receiving voltage signals which are set to voltages complementary to each other as the two control signals Vc1 and Vc2. The aforementioned expression "set to complementary voltages" denotes that when one voltage is set to a relatively low voltage, the other voltage is set to a relatively high voltage, and when one voltage is set to a relatively high voltage, the other voltage is set to a relatively low voltage.

The switch circuit section 19 is configured to include a capacitance element $21_2$, a transmission line $23_2$, and a capacitance element $25_2$ connected in series between the output port P2 and the antenna port PA; an inductor element 272 having one end connected to the control port P4 and the other end connected to a connection point (node) N2 between the capacitance element $21_2$ and the transmission line $23_2$; and a diode $29_2$ having an anode connected to the connection point N2 and a cathode connected to a ground potential (first power supply voltage). The transmission line $23_2$ has a transmission path length of $\frac{1}{4}\lambda$, corresponding to a wavelength $\lambda$ of a reception signal. This switch circuit section 19 turns on the diode $29_2$ when a relatively high voltage (for example, 1.2 V) is set as the control signal Vc2. Further, the diode $29_2$ is in a low impedance state, and the connection point N2 is fixed to the ground potential or a potential close to the ground potential. As a result, the switch circuit section 19 cuts off connection between the output port P2 and the antenna port PA. On the other hand, when a relatively low voltage (for example, 0.0 V) is set as the control signal Vc2, regarding operation of the switch circuit section 19, a reverse bias is applied to the diode $29_2$, which is then in an off state. Further, the diode $29_2$ is in a high impedance state, and the potential of the connection point N2 responds in accordance with a fluctuation in potential from the antenna port. As a result, connection between the output port P2 and the antenna port PA is electrified.

The switch circuit section 17 is configured to include a capacitance element $21_1$, a transmission line $23_1$, and a capacitance element $25_1$ connected in series between the input port P1 and the antenna port PA; a resistance element 31a and an inductor element 31b connected in series between a connection point (node) N1 between the transmission line $23_1$ and the capacitance element $21_1$ and the control port P3; a diode $29_1$ having an anode connected to the connection point N1 and a cathode connected to a connection point N0; a capacitance element 33a connected between the connection point N0 and the ground potential (first power supply voltage); and a charging/discharging circuit 40 to which the power supply voltage (second power supply voltage) Vcc and the control signal Vc1 are supplied, in which an input/output terminal A1 is connected to the connection point N0, and which charges the capacitance element 33a from the connection point N0 or discharges the capacitance element 33a from the connection point N0 in accordance with the value of the control signal Vc1. The transmission line $23_1$ is a line having a transmission path length of $\frac{1}{4}\lambda$, corresponding to the wavelength $\lambda$ of a transmission signal.

When a first voltage $V_1$ (a relatively high voltage) is applied as the control signal Vc1, relatively high voltage and current are supplied to the node N1 in accordance with the supplied voltage. When a second voltage $V_2$ ($V_2<V_1$) (a relatively low voltage) is applied as the control signal Vc1, a relatively low voltage is supplied to the node N1 in accordance with the supplied voltage. For example, the resistance element 31a is set to have a resistance value within a range of 20 to 200Ω, and the inductor element 31b is set within a range of 0.5 to 5 nH.

When the first voltage $V_1$ is applied as the control signal Vc1, regarding operation of the switch circuit section 17, a forward bias is applied to the diode $29_1$, which is then in an on state. Further, the diode $29_1$ is in a low impedance state, and the connection point N1 is fixed to the ground potential or a potential close to the ground potential. As a result, the switch circuit section 17 cuts off connection between the input port P1 and the antenna port PA. At this time, in order to maintain the diode $29_1$ in a forward bias state, the charging/discharging circuit 40 discharges the capacitance element 33a and functions such that the potential of the connection point N0 is maintained to be lower than the potential of the connection point N1.

The turned-on diode $29_1$ also has a function of charging the capacitance element 33a. However, charging of the capacitance element 33a may act in a direction in which the potential of the connection point N1 is raised and a forward bias applied to the diode $29_1$ is weakened. In order to prevent this, it is important that the charging/discharging circuit 40 sufficiently draws out a forward current of the diode $29_1$ and discharges the capacitance element 33a, and the potential of the connection point N0 is maintained to be lower than the potential of the connection point N1 without being raised.

When the second voltage $V_2$ is applied as the control signal Vc1, a reverse bias is applied to the diode $29_1$, which is then in an off state due to operation of the switch circuit section 17. Further, the diode $29_1$ is in a high impedance state, and the potential of the connection point N1 responds in accordance with the potential of the input port P1. As a result, the switch circuit section 17 electrifies connection between the input port P1 and the antenna port PA. At this time, in order to maintain the diode $29_1$ in a reverse bias state, the charging/discharging circuit 40 charges the capacitance element 33a and functions such that the potential of the connection point N0 is maintained to be equivalent to the potential of the connection point N1 or higher than the potential of the connection point N1.

Figure 3:
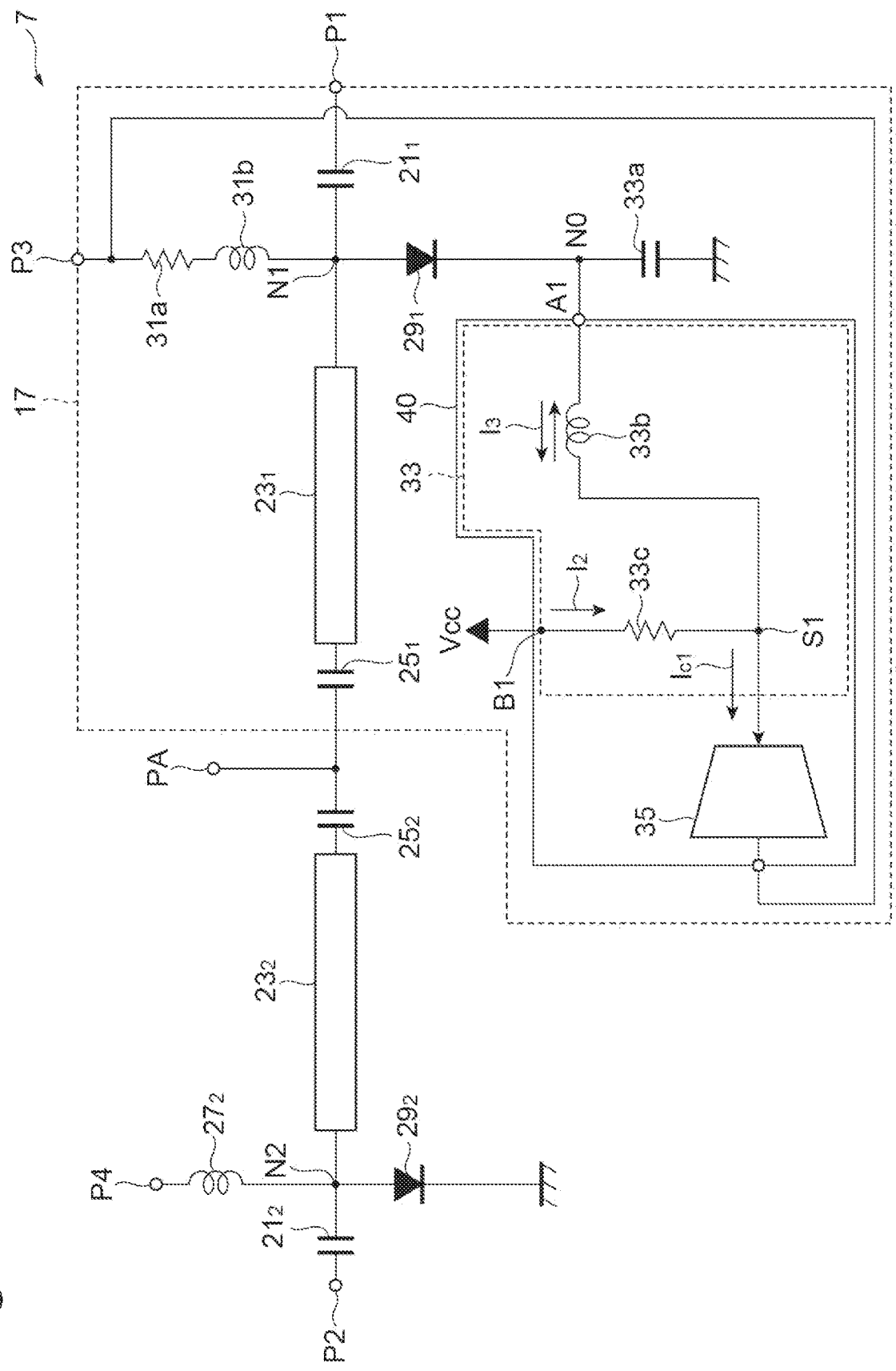
FIG. 3 is a circuit diagram illustrating a detailed configuration of the high-frequency switch circuit 7 in FIG. 1.

FIG. 3 is a circuit diagram illustrating a detailed configuration of the high-frequency switch circuit 7. In FIG. 3, a detailed configuration of the charging/discharging circuit 40 is depicted. The charging/discharging circuit 40 is configured to further include a capacitance voltage control circuit 33 and a drawing current generation circuit 35.

The capacitance voltage control circuit 33 has a node S1 connected to an output terminal of the drawing current generation circuit 35, and a node A1 connected to a cathode (connection point N0) of the diode $29_1$. The capacitance voltage control circuit 33 can be configured to include an inductor element 33b having one terminal connected to the node A1 and the other terminal connected to the node S1, and a resistance element 33c having one terminal connected to a power supply port B1 and the other terminal connected to the other terminal (node S1) of the inductor element 33b. The resistance element 33c is set within a range of 100 to 5,000Ω, for example. The inductor element 33b is an element for applying a DC voltage and is set within a range of 0.5 to 5 nH, for example.

The drawing current generation circuit 35 is connected to the control port P3 and generates a drawing current ($I_{C1}$) for drawing a forward current of the diode $29_1$, a current ($I_3$) for discharging the capacitance element 33a, and a bias current ($I_2$) flowing from the power supply voltage Vcc via the resistance element 33c when the diode $29_1$ is turned on in accordance with the control signal Vc1. That is, the drawing current generation circuit 35 generates the drawing current ($I_{C1}$) when the first voltage $V_1$ is set as the control signal Vc1. On the other hand, the drawing current generation circuit 35 stops the drawing current ($I_{C1}$) when the second voltage $V_2$ is set as the control signal Vc1.

In the capacitance voltage control circuit 33, the bias current ($I_2$) flowing from the power supply voltage Vcc via the resistance element 33c flows from the power supply port B1 toward the node S1 regardless of the control signal Vc1, but the current ($I_3$) flowing in the inductor element 33b varies in flowing direction in accordance with the control signal Vc1. When the first voltage $V_1$ is applied as the control signal Vc1, the drawing current generation circuit 35 generates the drawing current ($I_{C1}$), and the current ($I_3$) flowing in the inductor element 33b flows from the node A1 toward the node S1. Moreover, a current which has joined to the bias current ($I_2$) flows into the drawing current generation circuit 35 as the drawing current ($I_{C1}$). The current ($I_3$) flowing in the inductor element 33b functions as a current in which a forward current of the diode $29_1$ and a current for discharging the capacitance element 33a are joined.

On the other hand, when the second voltage $V_2$ is applied as the control signal Vc1, the drawing current generation circuit 35 stops the drawing current ($I_{C1}$), and the bias current ($I_2$) flows from the node S1 toward the node A1 in the inductor element 33b as it stands ($I_3$). The current ($I_3$) flowing in the inductor element 33b charges the capacitance element 33a via the node A1, raises the potential of the cathode (potential of the connection point N0) of the diode $29_1$, and reversely biases and turns off the diode $29_1$.

Figure 4A:
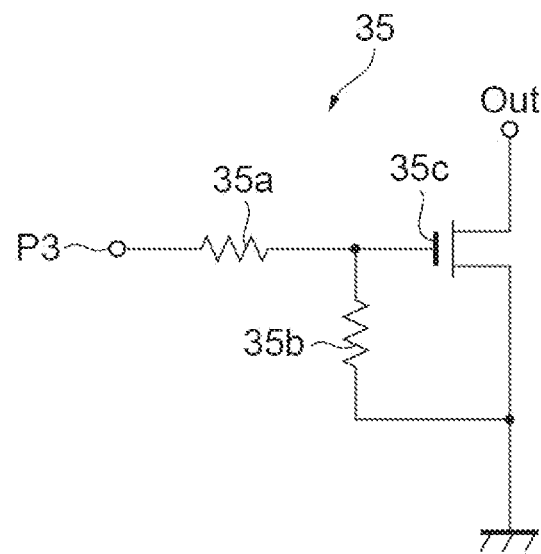
FIG. 4A is a circuit diagram illustrating a detailed configuration of a drawing current generation circuit 35 in FIG. 2.
Figure 4B:
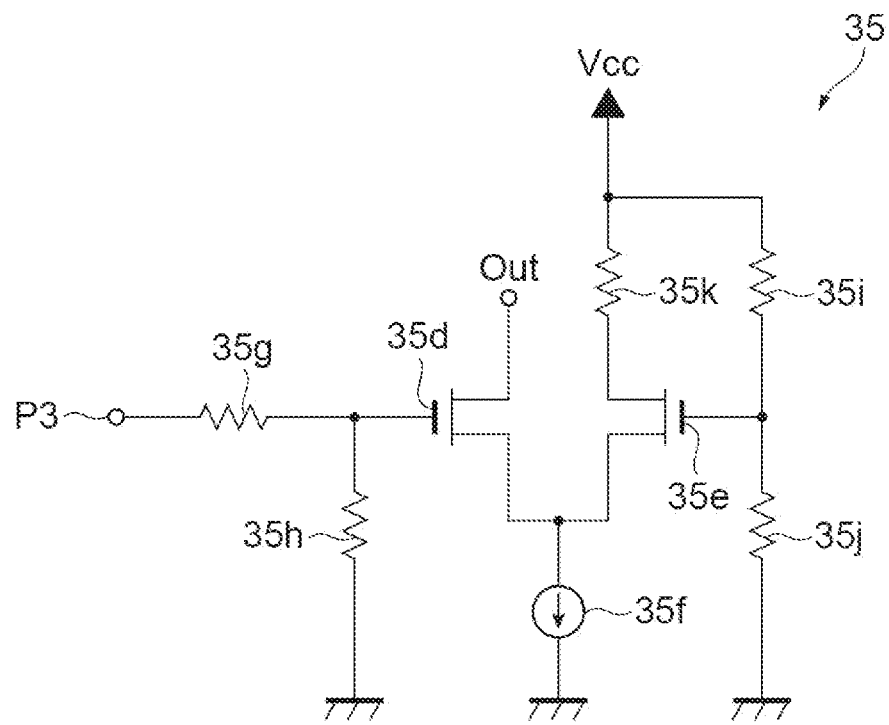
FIG. 4B is a circuit diagram illustrating another detailed configuration of the drawing current generation circuit 35 in FIG. 2.

Regarding a configuration of the drawing current generation circuit 35, for example, a configuration of an open drain output circuit is employed. For example, as illustrated in FIG. 4A, the drawing current generation circuit 35 has a circuit configuration including an FET 35c of which a gate is connected to the control port P3 via a resistance element 35a, a drain is set as an output terminal Out, and a source is grounded and connected to the gate via a resistance element 35b. Alternatively, as illustrated in FIG. 4B, the drawing current generation circuit 35 may have a circuit configuration including two FETs 35d and 35e and a current source 35f. In this FET 35d, the gate is connected to the control port P3 via a resistance element 35g and grounded via a resistance element 35h, the drain is set as the output terminal Out, and the source is connected to the current source 35f. In addition, in the FET 35e, a voltage divided by resistance elements 35i and 35j based on the power supply voltage Vcc is applied to the gate, the power supply voltage Vcc is applied to the drain via a resistance element 35k, and the source is connected to the current source 35f.

When the second voltage $V_2$ is applied as the control signal Vc1, the cathode potential to be set for the node A1 is set to the original power supply voltage Vcc and is then set to follow a peak voltage of the node N1 in the capacitance element 33a. Namely, it can be said that the capacitance element 33a has both a function of grounding the cathode of the diode $29_1$ in an alternating current manner and a function of retaining the cathode potential of the diode $29_1$ at a peak potential of the anode. The capacitance value of the capacitance element 33a is set within a range of 0.2 to 10 pF, for example.

Hereinafter, operation of the high-frequency switch circuit 7 of the present embodiment will be described in comparison with a comparative example.

Figure 10:
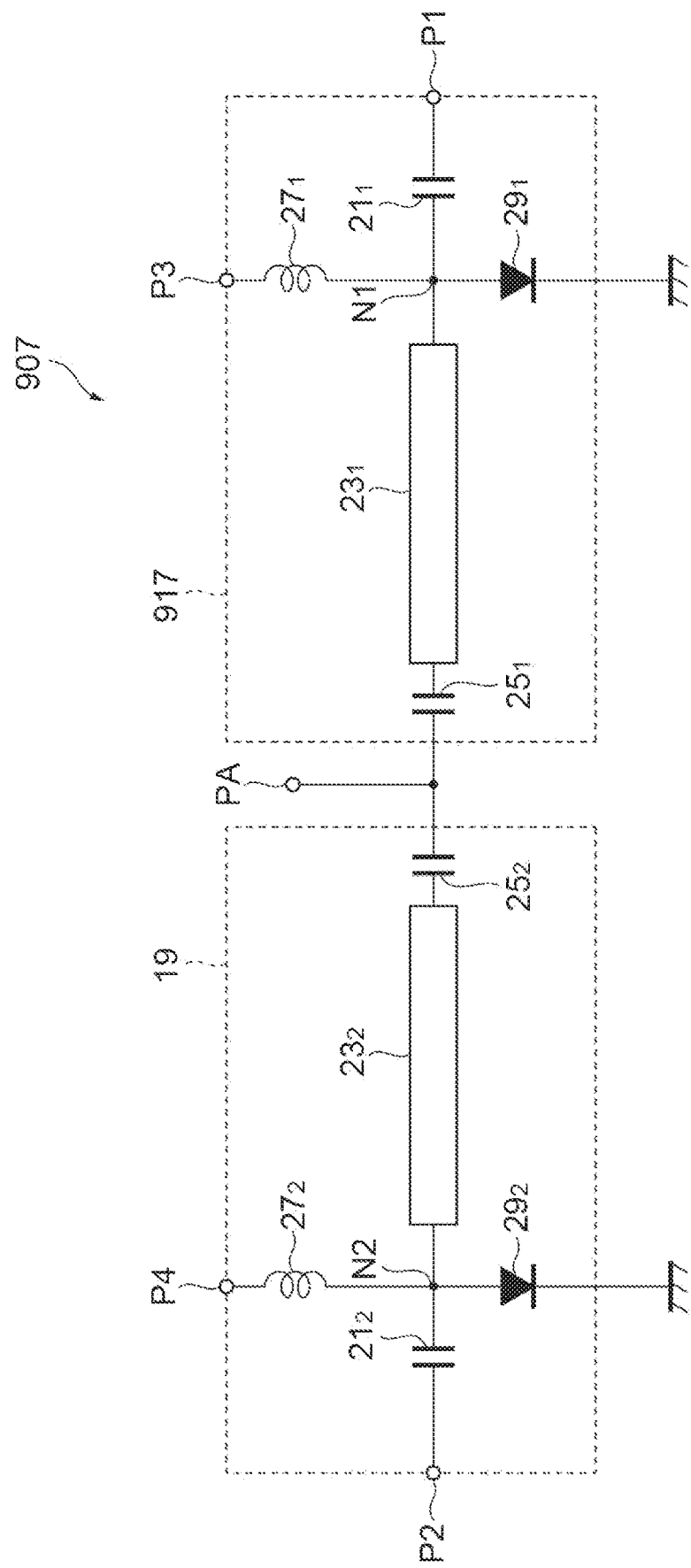
FIG. 10 is a circuit diagram illustrating a configuration of a high-frequency switch circuit 907 according to a comparative example.

FIG. 10 illustrates a configuration of a high-frequency switch circuit 907 according to the comparative example. The configuration of the high-frequency switch circuit 907 differs from the configuration of the present embodiment in that a switch circuit section 917 for switching connection between the input port P1 and the antenna port PA has a configuration similar to that of the switch circuit section 19 and is configured to include capacitance elements $21_1$ and $25_1$, the transmission line $23_1$, an inductor element $27_1$, and the diode $29_1$. For example, when the control signal Vc1=0.0 V and the control signal Vc2=1.2 V are set, this high-frequency switch circuit 907 electrifies connection between the antenna port PA and the input port P1 and cuts off connection between the antenna port PA and the output port P2. On the other hand, for example, when the control signal Vc1=1.2 V and the control signal Vc2=0.0 V are set, the high-frequency switch circuit 907 electrifies connection between the antenna port PA and the output port P2 and cuts off connection between the antenna port PA and the input port P1. Here, the high-frequency switch circuit is required to have a characteristic of transmitting a transmission signal input from the input port P1 to the antenna port PA with a low loss and a low distortion. In addition, switching of the high-frequency switch circuit is controlled in response to the control signals Vc1 and Vc2, but it is desirable that these control signals have a positive voltage. In addition, it is more desirable that the voltage be within a range of the power supply voltage (for example, within a range of 0 V to 4.0 V) because the circuit configuration can be simplified.

Figure 11:
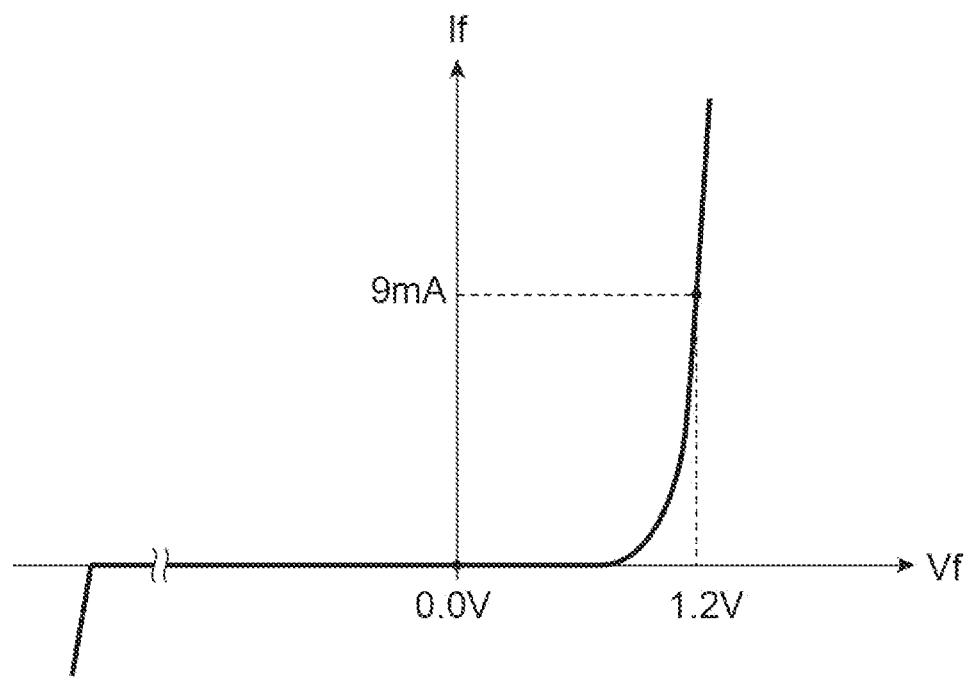
FIG. 11 is a graph illustrating DC characteristics of the diode $29_1$ configuring switch circuit sections 17 and 917.

FIG. 11 illustrates a relationship between a forward voltage Vf and a forward current If as DC characteristics of the diode $29_1$ configuring the switch circuit sections 17 and 917. In this manner, it is turned on in the vicinity of Vf=1.2 V, and the forward current If of approximately 9 mA is generated. At this time, the impedance between the anode and the cathode of the diode $29_1$ drops to approximately 5Ω in a DC component, for example, and the capacitance value between the anode and the cathode increases to approximately 3 pF, for example. Therefore, the diode $29_1$ has a low impedance with respect to a signal of a high-frequency range (for example, 30 GHz). In contrast, at a voltage of which Vf is 0 V or lower, the forward current If is substantially 0 mA, and the impedance between the anode and the cathode of the diode $29_1$ becomes a high impedance (open). Due to such characteristics of the diode $29_1$, in the switch circuit section 917, the diode $29_1$ is short-circuited between the anode and the cathode, and a transmission signal input from the input port P1 is cut off by applying 1.2 V to the diode $29_1$ in the forward direction. In addition, in the switch circuit section 917, the impedance between the anode and the cathode of the diode $29_1$ becomes open and a transmission signal input from the input port P1 is electrified by applying a voltage equal to or lower than 0 V to the diode $29_1$ in the forward direction.

Figure 12A:
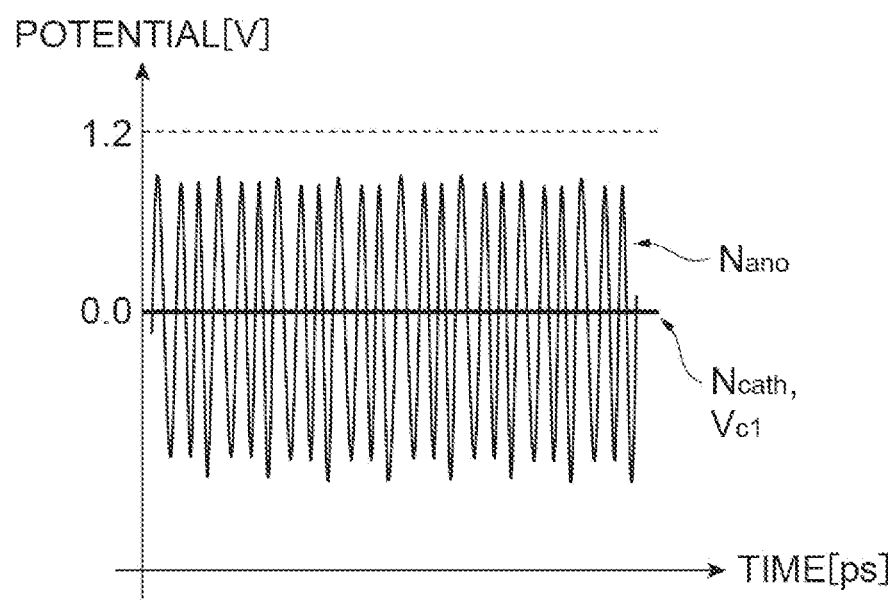
FIG. 12A is a graph illustrating change over time in potential in the diode $29_1$ of the high-frequency switch circuit 907 when a transmission signal having a relatively low amplitude is input at the time of electrification operation of the switch circuit section 917.
Figure 12B:
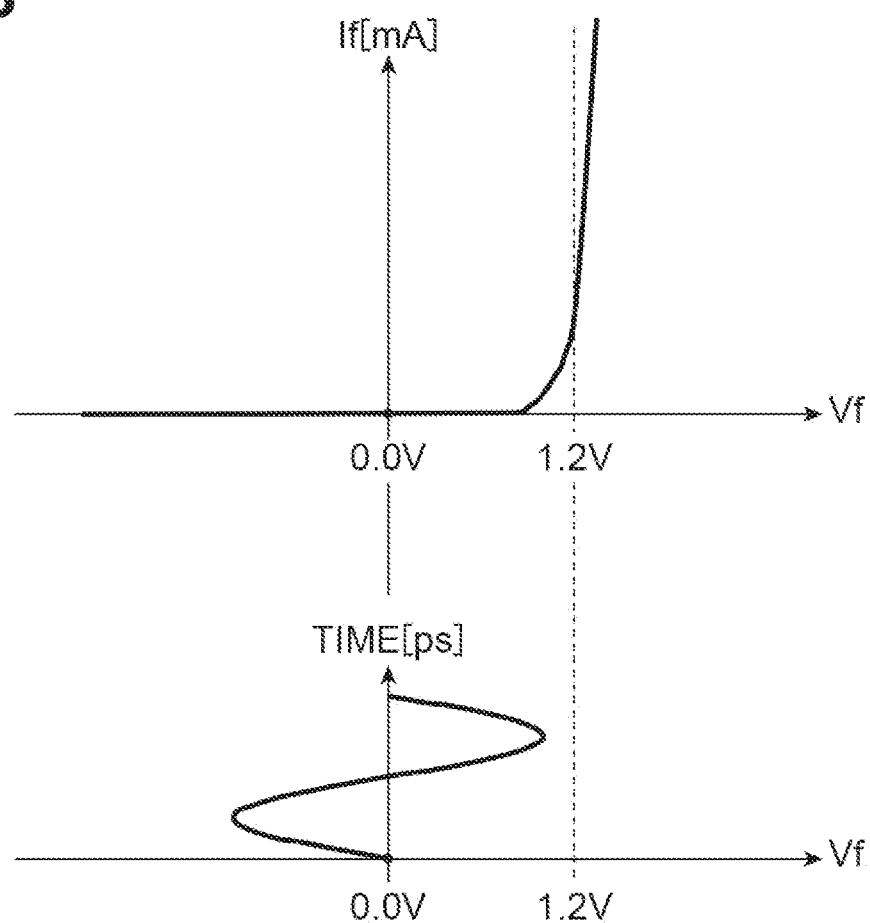
FIG. 12B is a graph illustrating change over time in DC characteristics and forward voltage in the diode $29_1$ of the high-frequency switch circuit 907.

FIGS. 12A and 12B illustrate change over time in potential in the diode $29_1$ of the high-frequency switch circuit 907 when a transmission signal having a relatively low amplitude (for example, 2.0 Vpp) is input at the time of electrification operation of the switch circuit section 917 (Vc1=0.0 V). FIG. 12A illustrates change over time in potential of the diode $29_1$, and FIG. 12B illustrates DC characteristics of the diode $29_1$ and change over time in forward voltage Vf of the diode $29_1$. $N_{ano}$ indicates the anode potential of the diode $29_1$, and $N_{cath}$ indicates the cathode potential of the diode $29_1$. As illustrated in FIG. 12A, the average value of the anode potential $N_{ano}$ is 0.0 V, and the peak voltage of the anode potential $N_{ano}$ when a voltage having an amplitude of 2.0 Vpp is input is 1.0 V. In this case, as illustrated in FIG. 12B, since the forward voltage Vf of the diode $29_1$ with respect to a forward voltage 1.2 V when the diode $29_1$ is turned on is low at all times, the diode $29_1$ retains open characteristics at all times. As a result, no distortion occurs in a transmission signal transmitted to the antenna port PA.

Figure 13A:
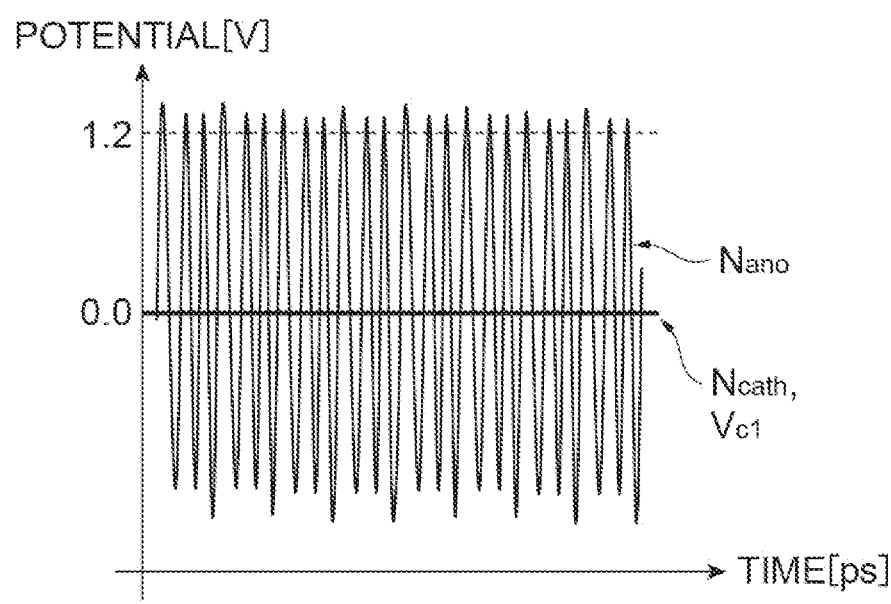
FIG. 13A is a graph illustrating change over time in potential in the diode $29_1$ of the high-frequency switch circuit 907 when a transmission signal having a relatively high amplitude is input at the time of electrification operation of the switch circuit section 917.
Figure 13B:
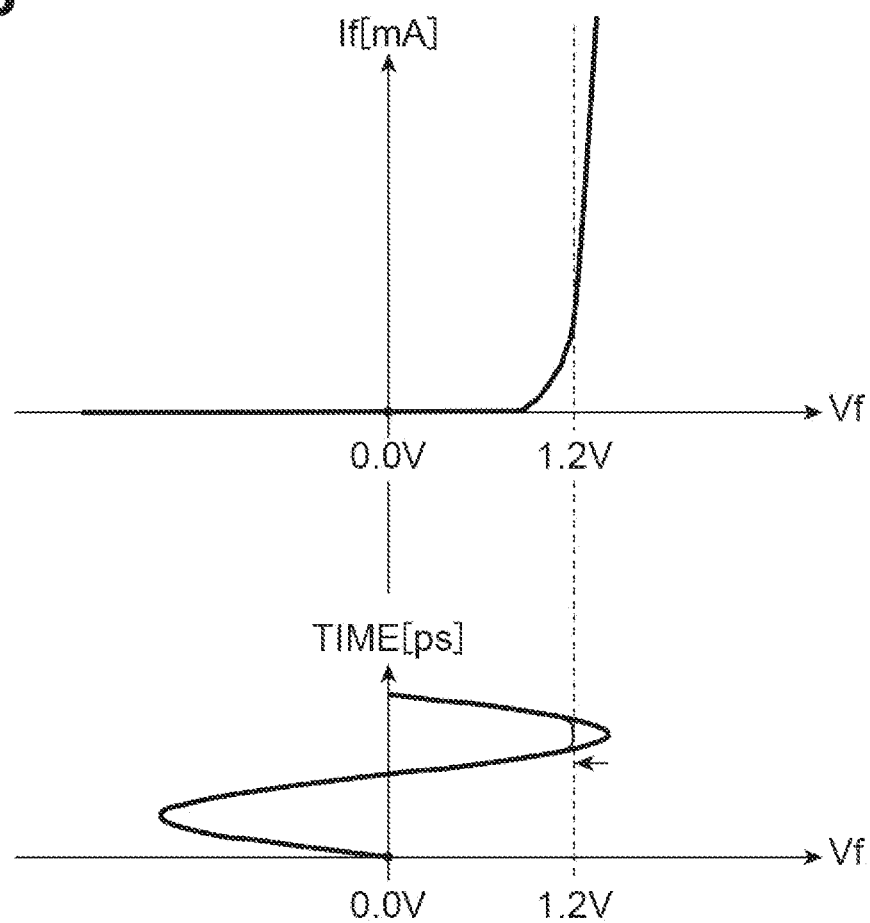
FIG. 13B is a graph illustrating change over time in DC characteristics and forward voltage in the diode $29_1$ of the high-frequency switch circuit 907.

In addition, FIGS. 13A and 13B illustrate change over time in potential in the diode $29_1$ of the high-frequency switch circuit 907 when a transmission signal having a relatively high amplitude (for example, an amplitude exceeding 2.4 Vpp) is input at the time of electrification operation of the switch circuit section 917 (Vc1=0.0 V). FIG. 13A illustrates change over time in potential of the diode $29_1$, and FIG. 13B illustrates DC characteristics of the diode $29_1$ and change over time in forward voltage Vf of the diode $29_1$. As illustrated in FIG. 13A, the average value of the anode potential $N_{ano}$ is 0.0 V, and the peak voltage of the anode potential $N_{ano}$ when a voltage having an amplitude equal to or higher than 2.4 Vpp is input reaches 1.2 V. In this case, as illustrated in FIG. 13B, when the forward current If flows in the diode $29_1$, the impedance of the diode $29_1$ drops, and the peak voltage of the anode of the diode $29_1$ decreases. As a result, a distortion occurs in a transmission signal transmitted to the antenna port PA.

Figure 14A:
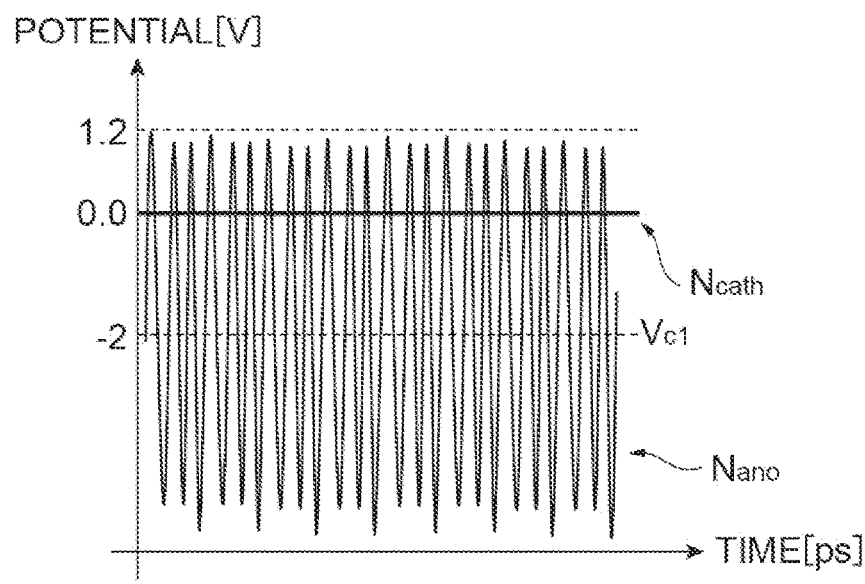
FIG. 14A is a graph illustrating change over time in potential in the diode $29_1$ of the high-frequency switch circuit 907 when a transmission signal having a relatively high amplitude is input at the time of electrification operation of the switch circuit section 917.
Figure 14B:
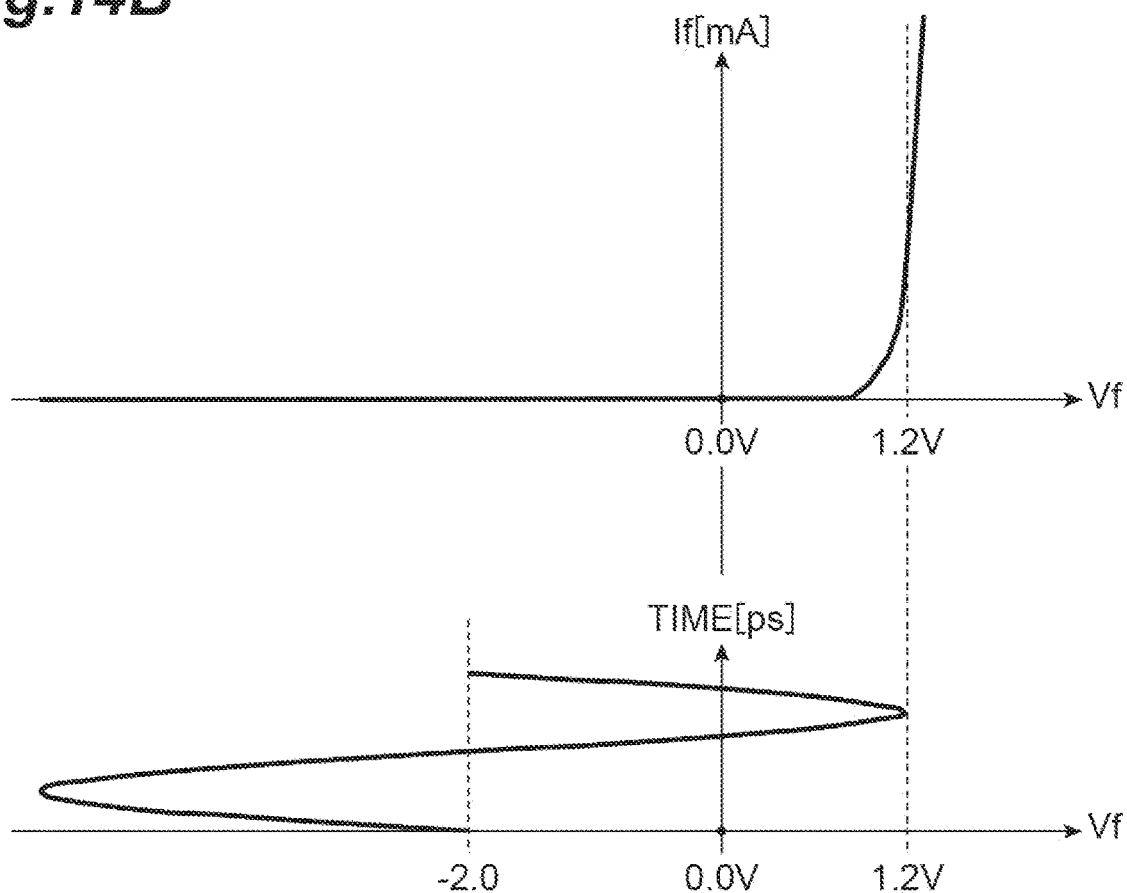
FIG. 14B is a graph illustrating change over time in DC characteristics and forward voltage in the diode $29_1$ of the high-frequency switch circuit 907.

Regarding a method for avoiding occurrence of a distortion in the high-frequency switch circuit 907 as described above, a method of setting a negative voltage in the control signal Vc1 can be considered. FIGS. 14A and 14B illustrate change over time in potential in the diode $29_1$ of the high-frequency switch circuit 907 when a transmission signal having a relatively high amplitude is input at the time of electrification operation of the switch circuit section 917 (Vc1=−2.0 V). FIG. 14A illustrates change over time in potential of the diode $29_1$, and FIG. 14B illustrates DC characteristics of the diode $29_1$ and change over time in forward voltage Vf of the diode $29_1$. In this case, it is possible to avoid a situation in which the diode $29_1$ is turned on when a transmission signal having an amplitude of approximately (2.0 V+1.2 V)×2=6.4 Vpp is input. As a result, it is possible to realize a high-frequency switch circuit in which a transmission signal having an amplitude up to 6.4 Vpp can be electrified without causing a distortion. However, in this method, there is a need to add a negative power supply circuit to the control circuit in order to generate the control signal Vc1 having a negative voltage, and therefore the circuit size of the control circuit increases. In order to prevent the circuit size of the control circuit from increasing, it is desirable that the control signal Vc1 be able to be controlled by being set to a voltage within a range of zero to the power supply voltage Vcc. In addition, in the foregoing method, the magnitude of the amplitude of a transmission signal in which a distortion can be prevented depends on the degree of a negative voltage which the diode $29_1$ can withstand.

Figure 15:
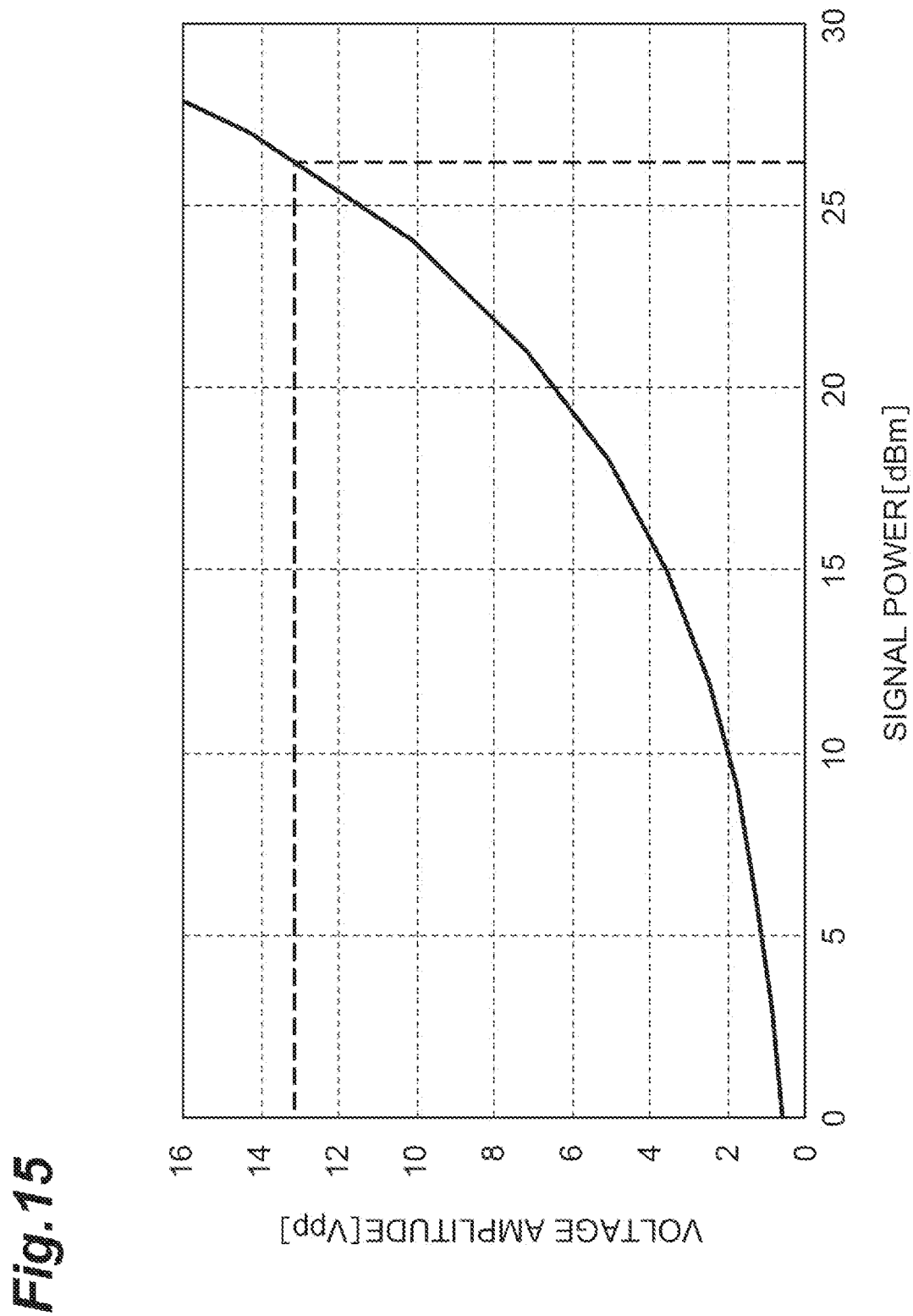
FIG. 15 is a graph illustrating a relationship between signal power of an input transmission signal and a voltage amplitude of a node N1 in the high-frequency switch circuit 907.

FIG. 15 illustrates a relationship between signal power of a transmission signal input to the high-frequency switch circuit 907 and a voltage amplitude of the node N1. The node N1 has an impedance of 50Ω in a high-frequency range (for example, 30 GHz), and signal power and a voltage signal have a relationship in which the voltage amplitude increases with respect to increase in signal power. For example, when a transmission signal having signal power of 26 dBm is input, the voltage amplitude of the node N1 becomes 13 Vpp. In this case, in order to perform transmission without a distortion using the foregoing method, the control signal Vc1 is required to have a deep negative voltage equal to or lower than −1×(13.0/2−1.2)=−5.3 V. In this case, it exceeds the deepest negative voltage (−4.0 V) which can be applied within the range of the power supply voltage Vcc (0 to 4.0 V), and thus the circuit size tends to increase.

Figure 5:
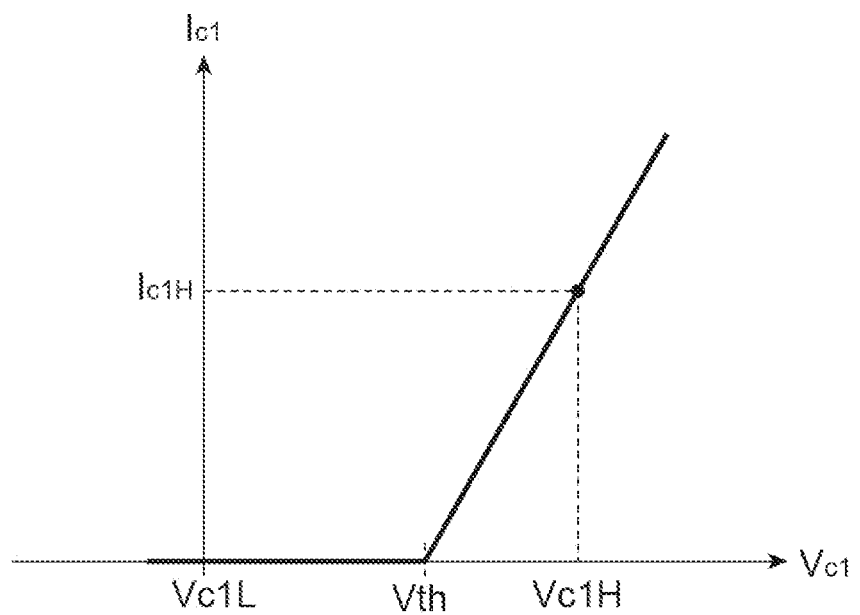
FIG. 5 is a graph illustrating output characteristics of the drawing current generation circuit 35 in FIG. 2.

In contrast, as illustrated in FIG. 3, in the high-frequency switch circuit 7 of the present embodiment, the switch circuit section 17 includes the capacitance voltage control circuit 33 and the drawing current generation circuit 35. FIG. 5 illustrates a relationship between a voltage value $V_{c1}$ of the control signal Vc1 and a current value $I_{c1}$ of the drawing current in the drawing current generation circuit 35. In this manner, the drawing current generation circuit 35 generates a drawing current having a current value $L_{c1H}$ when the control signal Vc1 having a first voltage value Vc1H exceeding a threshold voltage Vth is received. This threshold voltage Vth is set within a range of 0.1 to 3 V, for example. In contrast, the first voltage value Vc1H is set within a range of 1.0 to 5.0 V. In addition, the drawing current generation circuit 35 stops the drawing current when the control signal Vc1 having a second voltage value Vc1L equal to or lower than the threshold voltage Vth is received. This second voltage Vc1L is set within a range of 0.0 to 0.5 V. The current value $I_{c1H}$ of a drawing current generated by the drawing current generation circuit 35 is set within a range of 2 to 20 mA, for example.

In the high-frequency switch circuit 7 of the present embodiment, when the control signal Vc1 is set to 2.0 V, for example, the high-frequency switch circuit 7 cuts off connection between the input port P1 and the antenna port PA. At this time, the drawing current $I_{c1}$ is generated by the drawing current generation circuit 35, and the forward current $I_f$, the current $I_3$ flowing in the inductor element 33b, and the current $I_2$ flowing in the resistance element 33c are set due to the function of the capacitance voltage control circuit 33 and the drawing current generation circuit 35. The currents $I_2$ and $I_3$ are currents divided from the drawing current $I_{c1}$. This current $I_3$ becomes the forward current $I_f$. As a result, the diode $29_1$ is turned on.

Figure 6A:
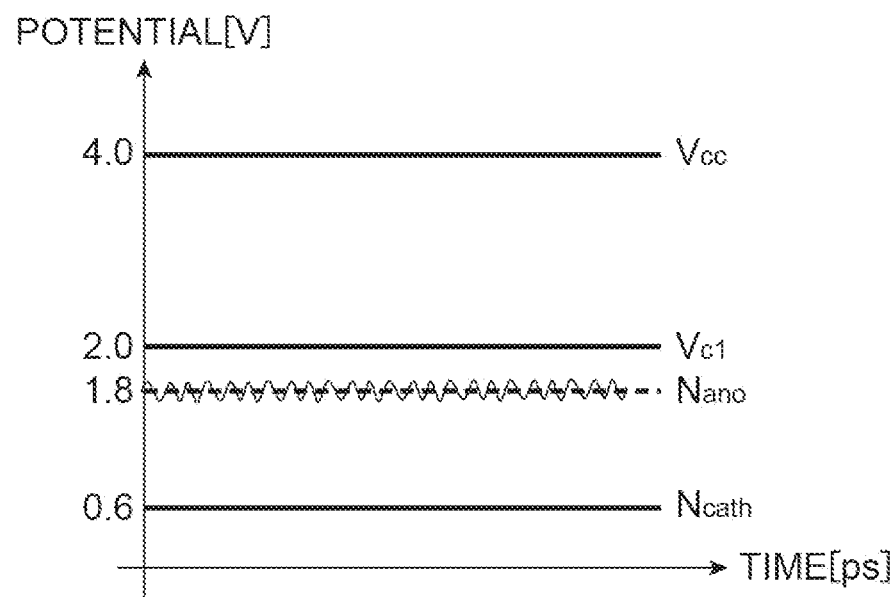
FIG. 6A is a graph illustrating voltage change in each part of the high-frequency switch circuit 7 in FIG. 1.
Figure 6B:
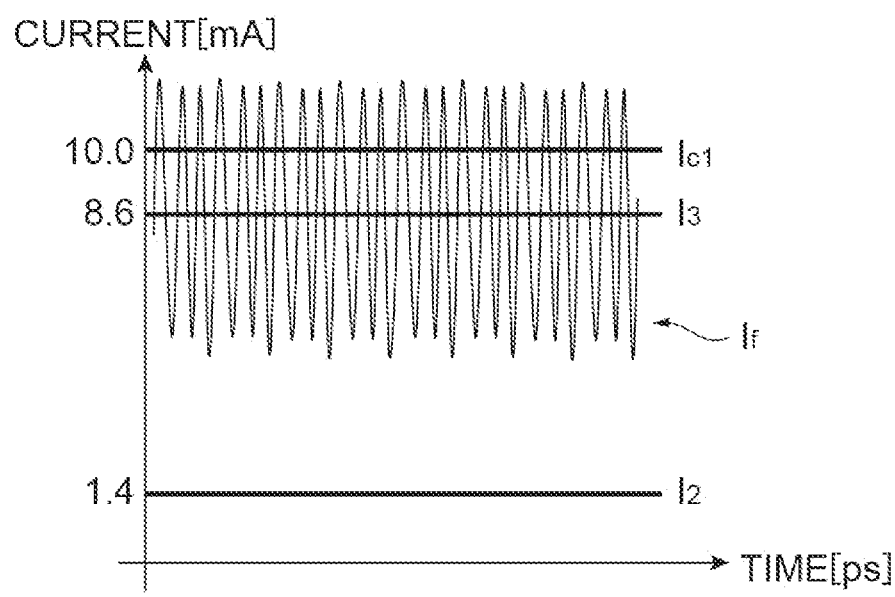
FIG. 6B is a graph illustrating current change in each part of the high-frequency switch circuit 7 in FIG. 1.

FIGS. 6A and 6B illustrate voltage change and current change in each part in the high-frequency switch circuit 7 at this time. FIG. 6A illustrates voltage change in each part, and FIG. 6B illustrates current change in each part. Here, the resistance value of the resistance element 33c is set to 1 kΩ, the resistance value of the resistance element 31a is set to 23Ω, and the turn-on voltage of the diode $29_1$ is set to 1.2 V. In this case, the drawing current $I_{c1}$ is set to 10 mA, the current $I_2$=1.4 mA and the current $I_3$=8.6 mA are set, and the forward voltage Vf=1.2 V is realized. In addition, since a high-frequency signal (for example, a signal in a frequency band of 30 GHz) input from the input port P1 is substantially fixed to the ground potential via the diode $29_1$ and the capacitance element 33a, the forward current $I_f$ becomes a modulated current. However, since the diode $29_1$ is set to have a sufficiently low impedance as long as a forward bias is applied between the anode and the cathode as a DC bias, a small voltage amplitude is set to the potential $N_{ano}$ applied to the node N1. As a result, leakage of a high-frequency signal from the input port P1 to the antenna port PA is curbed.

As illustrated in FIG. 6B, since the drawing current $I_{c1}$ and the current $I_3$ flowing in the inductor have values approximately equivalent to the forward current $I_f$ of the diode $29_1$, the drawing current generation circuit 35 can reliably draw the forward current $I_f$ of the turned-on diode $29_1$. As a result, as illustrated in FIG. 6A, a potential rise of a potential due to charging of the capacitance element 33a, that is, the cathode potential $N_{cath}$ of the diode $29_1$ is curbed, and 1.2 V required to turn on the diode $29_1$ is achieved in the potential difference between the cathode potential $N_{cath}$ and the anode potential $N_{ano}$ (forward bias of the diode $29_1$).

In addition, in the high-frequency switch circuit 7, when the control signal Vc1 is set to 0.0 V, for example, the high-frequency switch circuit 7 electrifies connection between the input port P1 and the antenna port PA. At this time, the drawing current $I_{c1}$ is stopped by the drawing current generation circuit 35. At this time, the potential $N_{ano}$ of the node N1 becomes substantially 0 V. On the other hand, the capacitance element 33a is charged due to the function of the charging/discharging circuit 40, and the potential $N_{cath}$ of the node N0 becomes substantially equivalent to the power supply voltage Vcc. As a result, a deep negative voltage (reverse bias) is applied as the bias voltage Vf of the diode $29_1$, and the diode $29_1$ is turned off.

Figure 7A:
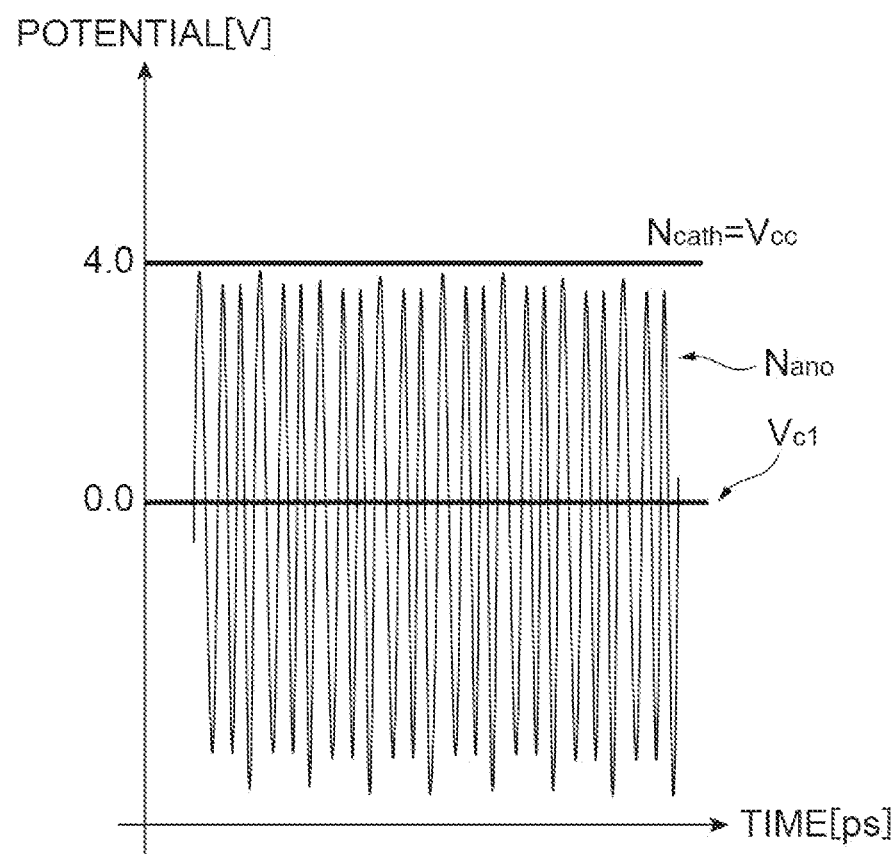
FIG. 7A is a graph illustrating voltage change in each part of the high-frequency switch circuit 7 in FIG. 1.
Figure 7B:
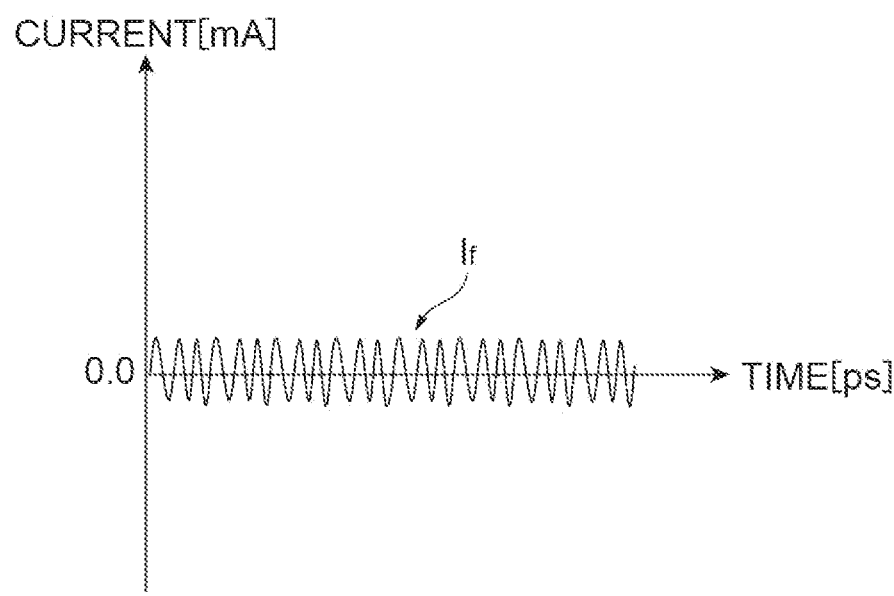
FIG. 7B is a graph illustrating current change in each part of the high-frequency switch circuit 7 in FIG. 1.

FIGS. 7A and 7B illustrate voltage change and current change in each part in the high-frequency switch circuit 7 at this time. FIG. 7A illustrates voltage change in each part, and FIG. 7B illustrates current change in each part. In this case, the drawing current $I_{c1}$ is set to 0 mA, and potential $N_{cath}$=power supply voltage Vcc is realized. In addition, 0 V is set for the potential $N_{ano}$ of the node N1 as the DC component. However, since a high-frequency signal is applied to the node N1, a high-frequency component (for example, a high-frequency component having a peak voltage of 4.0 V) corresponding thereto is superimposed on the potential $N_{ano}$. In addition, in the current $I_f$ of the diode $29_1$, a slightly high-frequency component transmitted through a capacitance component included in the diode $29_1$ according to addition of a high-frequency signal is added to the DC component of 0 mA. In this manner, since a negative voltage is set to the forward voltage Vf of the diode $29_1$, an off state of the diode $29_1$ is maintained, and a high-frequency signal is transmitted from the input port P1 toward the antenna port PA.

In addition, in the high-frequency switch circuit 7, when the control signal Vc1 is set to 0.0 V, for example, and when a transmission signal having a large voltage amplitude is input, the capacitance voltage control circuit 33 operates as follows. That is, when a transmission signal having a large voltage amplitude of approximately 13 Vpp is input, for example, the capacitance voltage control circuit 33 charges the capacitance element 33a and further raises the potential of the node A1 than the power supply voltage Vcc based on the forward current $I_f$ flowing in the diode $29_1$ when the transmission signal is at the peak. At this time, due to the presence of the resistance element 33c having high resistance, a high potential state of the node A1 is maintained until the time of a next peak of a transmission signal. Namely, the diode $29_1$, the capacitance element 33a, and the resistance element 33c operate as an envelope detection circuit and have a function of causing the potential $N_{cath}$ to follow the peak voltage of the node N1. Accordingly, the DC component of the forward voltage Vf of the diode $29_1$ is set to a sufficiently deep negative voltage (for example, −5.5 V). A distortion in a transmission signal transmitted to the antenna port PA is curbed.

Figure 8:
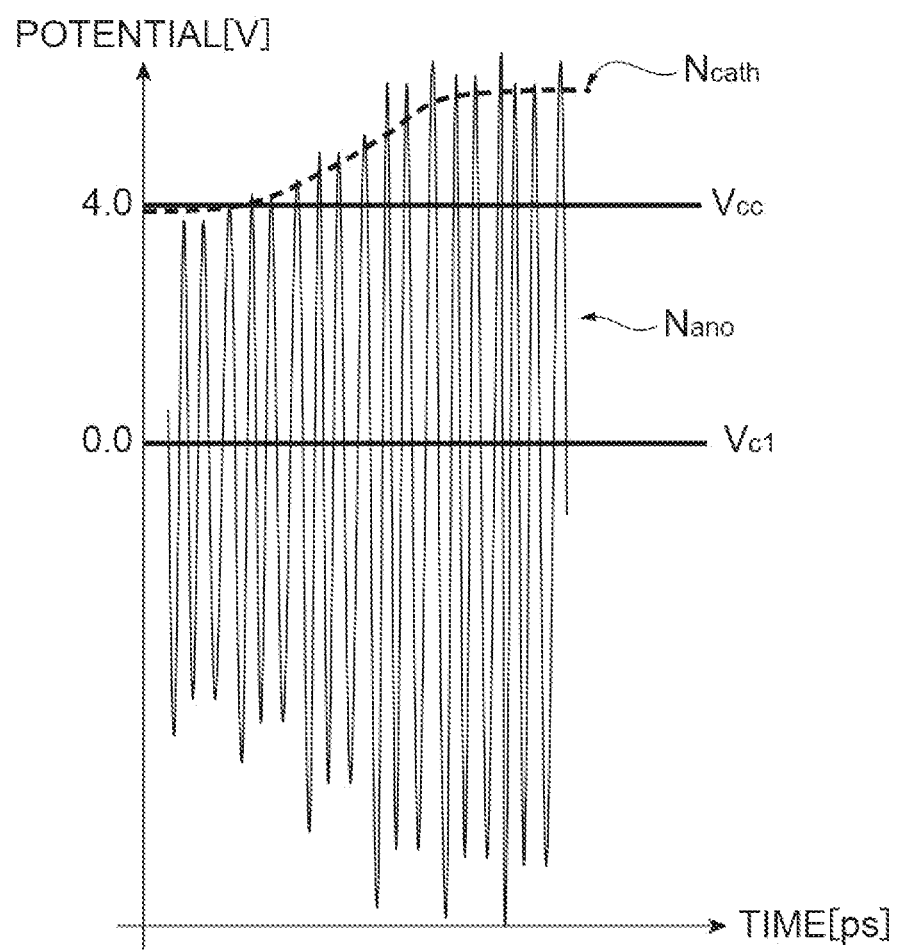
FIG. 8 is a graph illustrating voltage change in each part of the high-frequency switch circuit 7 in FIG. 1.

FIG. 8 illustrates voltage change in each part in the high-frequency switch circuit 7 at this time and illustrates change in cathode potential and anode potential of the diode $29_1$. Here, a case in which the control signal Vc1 is set to 0.0 V and the voltage amplitude of the transmission signal is raised from 8.0 Vpp to 13.0 Vpp is illustrated.

As illustrated in FIG. 8, in accordance with rise of the voltage amplitude, the peak potential of the anode potential $N_{ano}$ of the diode $29_1$ exceeds the power supply voltage Vcc (=4.0 V) and reaches a value in the vicinity of 6 V. In contrast, since the cathode potential $N_{cath}$ of the diode $29_1$ is set to a value in the vicinity of the power supply voltage Vcc, the forward voltage Vf exceeds 1.2 V and the diode $29_1$ is turned on. Accordingly, the capacitance element 33a is charged based on the forward current $I_f$, and the cathode potential $N_{cath}$ rises beyond the power supply voltage Vcc. If the cathode potential $N_{cath}$ rises beyond the power supply voltage Vcc, the current $I_2$ flows, and the capacitance element 33a is discharged. However, since a resistance value R1 of the resistance element 33c is set to a large value (for example, 1 kΩ), the cathode potential $N_{cath}$ is maintained as a high voltage in a state in which the forward current $I_f$ is large to a certain degree. The foregoing current $I_2$ has a value calculated by the following expression; $I_2 = -(N_{cath} - V_{cc})/R1$. Namely, the cathode potential $N_{cath}$ is made stable at a potential (for example, 4.8 V) in which the amount of power supplied to the capacitance element 33a and the amount of discharge by the current $I_2$ at the peak voltage of the node N1 are balanced.

Operation of the capacitance element 33a retaining a voltage at this time will be described in detail with reference to FIG. 9. When the anode potential $N_{ano}$ exceeds the power supply voltage Vcc=4.0 V and further exceeds 5.2 V due to increase in amplitude of a transmission signal, the forward current $I_f$ is generated because the forward voltage Vf of the diode $29_1$ exceeds 1.2 V. This forward current $I_f$ charges the capacitance element 33a and raises the cathode potential $N_{cath}$. If the cathode potential $N_{cath}$ is raised, the current $I_2$ is generated, the capacitance element 33a is discharged, and the cathode potential $N_{cath}$ slightly drops until a next peak voltage of a transmission signal is generated. Thereafter, the capacitance element 33a is charged again due to generation of a next peak voltage, and the cathode potential $N_{cath}$ rises again. By repeating such operation, the cathode potential $N_{cath}$ is made stable at a high potential. Specifically, as indicated in the expression described above, since the magnitude of the current $I_2$ is proportional to the cathode potential $N_{cath}$, the cathode potential $N_{cath}$ is made stable in a state in which a charge current due to the forward current $I_f$ and a discharge current due to the current $I_2$ are temporally equalized. As a result of rise of the cathode potential $N_{cath}$ beyond the power supply voltage Vcc through a series of such operation, a DC component of a reverse voltage applied to the diode $29_1$ is raised. As a result, a waveform distortion due to a forward voltage clip of the diode $29_1$ with respect to a transmission signal having a large amplitude is reduced.

Figure 9:
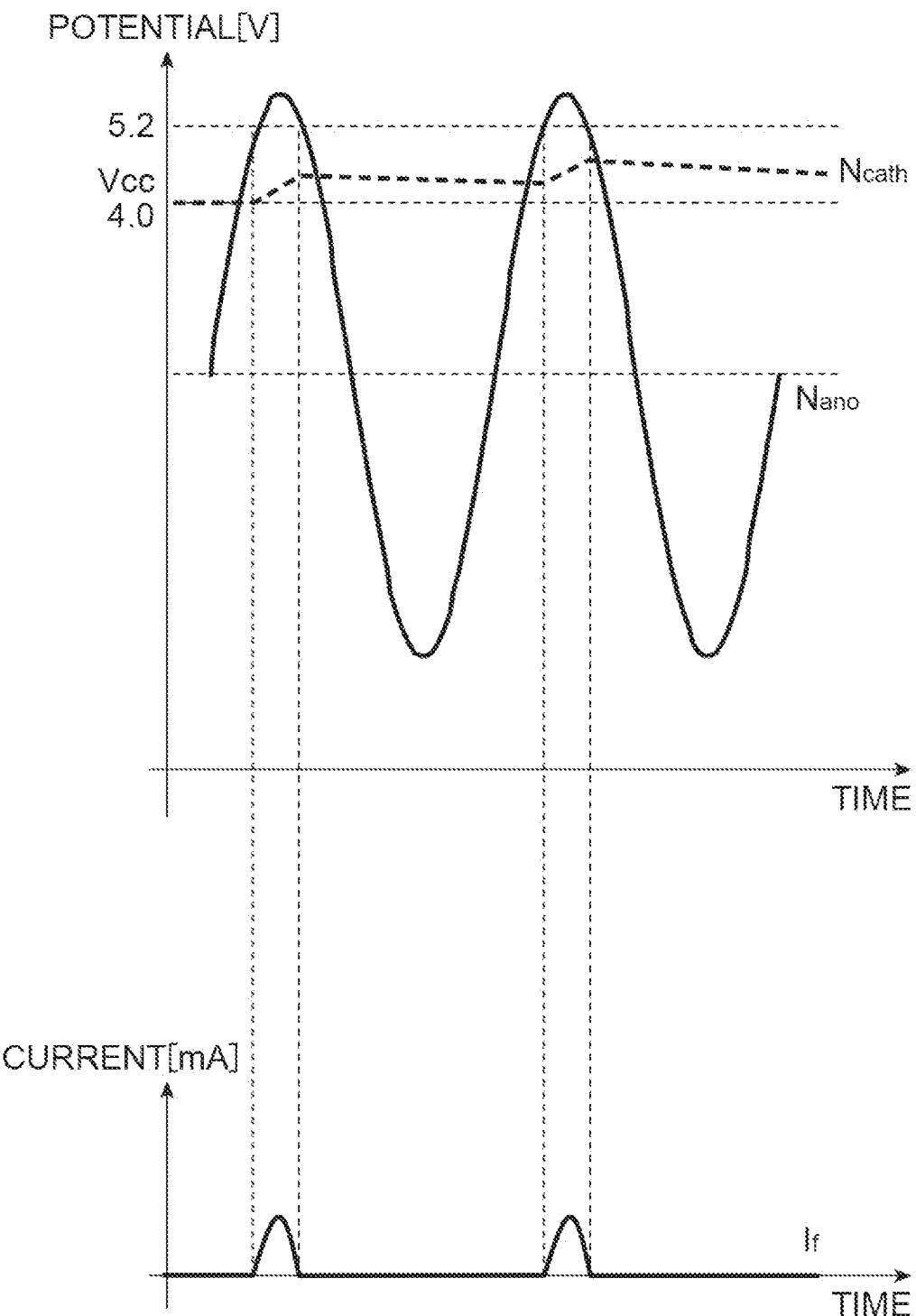
FIG. 9 is a graph illustrating change in cathode potential, anode potential, and forward current of a diode $29_1$ in FIG. 2.

As illustrated in FIG. 9, since a charge potential of the cathode potential $N_{cath}$ is determined based on the power supply voltage Vcc, in order to further reduce a waveform distortion due to the forward voltage clip described above, it can be solved by increasing the value of the power supply voltage Vcc to be larger than the expected largest peak value of the amplitude of a transmission signal.

According to the high-frequency switch circuit 7 of the present embodiment described above, connection between the antenna port PA and the input port P1 is electrified or cut off in accordance with the control signal Vc1 due to operation of the switch circuit section 17, and connection between the antenna port PA and the output port P2 is electrified or cut off in accordance with the control signal Vc2 due to operation of the switch circuit section 19. At this time, in the switch circuit section 17, connection between the antenna port PA and the input port P1 is electrified/cut off when a forward current of the diode $29_1$ is turned on/off in accordance with the control signal Vc1 by the capacitance voltage control circuit 33 and the drawing current generation circuit 35. At the same time, since the potential of the cathode of the diode $29_1$ is set to follow the peak potential of the anode when a forward current of the diode $29_1$ is turned off by the capacitance voltage control circuit 33, even if the amplitude of an input transmission signal increases, the diode $29_1$ can be prevented from being turned on. As a result, a voltage distortion in a transmission signal output to the antenna port PA can be reduced with a simple circuit configuration.

In addition, the drawing current generation circuit 35 generates a drawing current in accordance with the control signal Vc1 set to a first voltage and stops the drawing current in accordance with the control signal Vc1 set to a second voltage. In addition to this, the capacitance voltage control circuit 33 turns on the diode $29_1$ by setting the potential of the cathode to a first setting potential based on the power supply voltage Vcc supplied from the power supply port B1 when a drawing current is generated, and turns off the diode $29_1$ by setting the potential of the cathode to a second setting potential higher than the first setting potential based on the power supply voltage Vcc when a drawing current is stopped. Due to the configuration, on/off control of the diode $29_1$ according to the control signal Vc1 can be stably realized. Accordingly, control of electrification or cutting off between the antenna port PA and the input port P1 is made stable by the switch circuit section 17.

In addition, the capacitance voltage control circuit 33 has the inductor element 33b having one terminal connected to the cathode of the diode $29_1$ and the other terminal connected to the output terminal of the drawing current generation circuit 35, the resistance element 33c having one terminal connected to the power supply port B1 and the other terminal connected to the other terminal of the inductor element 33b, and the capacitance element 33a connected between the cathode of the diode $29_1$ and the ground. With such a simple circuit configuration, a function of switching the cathode potential in accordance with generation of a drawing current, and a function of setting the cathode potential following the anode potential can be realized. As a result, a voltage distortion in a transmission signal output to the antenna port PA can be reduced with a simple configuration.

Hereinabove, principles of the present disclosure have been illustrated and described in a preferable embodiment. However, it will be appreciated by those skilled in the art that the present disclosure may be modified in arrangement and details without departing from such principles. The present disclosure is not limited to any particular configuration disclosed in the present embodiment. Therefore, all the amendments and changes that come from the claims and the scope of the gist thereof are claimed.

What is claimed is:

1. A high-frequency switch circuit comprising:
    an antenna terminal configured to be connected to an external antenna;
    an output terminal configured to output a high-frequency reception signal;
    an input terminal configured to input a high-frequency transmission signal;
    a first control terminal configured to input a first control signal, the first control terminal being connected to a first node via a first resistance element and a first inductor element connected in series;
    a second control terminal configured to input a second control signal;
    a first switch configured to electrify or cut off connection between the antenna terminal and the input terminal in accordance with the first control signal; and
    a second switch configured to electrify or cut off connection between the antenna terminal and the output terminal in accordance with the second control signal,
    wherein the first switch has:
        a transmission line connecting the antenna terminal and the input terminal to each other,
        a diode having an anode connected to the first node and a cathode connected to a second node, the first node being between the transmission line and the input terminal, and
        a capacitance element connected to the second node and a first power supply voltage, and
        a charging/discharging circuit connected to a second power supply voltage and the first control terminal and charging and discharging the capacitance element from the second node in accordance with the first control signal, the charging/discharging circuit including a capacitance voltage control circuit and a current generation circuit,
    wherein the capacitance voltage control circuit:
        is connected to the cathode of the diode and the first control terminal, and performs any of charging of the capacitance element from the second node or drawing of a diode current from the second node and drawing of a discharge current of the capacitance element in accordance with the first control signal, and wherein the current generation circuit is an open drain output circuit that generates a drawing current for performing the drawing.

2. The high-frequency switch circuit according to claim 1, wherein the capacitance voltage control circuit:
sets a potential of the second node to a potential lower than a potential of the first node and turns on the diode at the time of the drawing, and
sets the potential of the second node to a potential higher than the potential of the first node and turns off the diode at the time of charging of the capacitance element.

3. The high-frequency switch circuit according to claim 2, wherein the capacitance voltage control circuit has:
a second inductor element having one terminal connected to the cathode of the diode, and the other terminal connected to an output terminal of the current generation circuit, and
a second resistance element having one terminal connected to the second power supply voltage, and the other terminal connected to the other terminal of the second inductor element.

4. The high-frequency switch circuit according to claim 1, wherein the current generation circuit includes a transistor having a gate connected to the first control terminal, a drain connected to the output terminal, and a grounded source.

5. A front-end circuit comprising:
the high-frequency switch circuit according to claim 1;
a transmission signal amplifier connected to the input terminal of the high-frequency switch circuit, the transmission signal amplifier amplifying the transmission signal from the outside, and inputting the transmission signal to the high-frequency switch circuit; and
a reception signal amplifier connected to the output terminal of the high-frequency switch circuit, the reception signal amplifier amplifying the reception signal from the high-frequency switch circuit, and outputting the reception signal to the outside.

6. A high-frequency switch circuit comprising:
an antenna terminal configured to be connected to an external antenna;
an output terminal configured to output a high-frequency reception signal;
an input terminal configured to input a high-frequency transmission signal;
a first control terminal configured to input a first control signal, the first control terminal being connected to a first node via a first resistance element and a first inductor element connected in series;
a second control terminal configured to input a second control signal;
a first switch configured to electrify or cut off connection between the antenna terminal and the input terminal in accordance with the first control signal; and
a second switch configured to electrify or cut off connection between the antenna terminal and the output terminal in accordance with the second control signal,
wherein the first switch has:
a transmission line connecting the antenna terminal and the input terminal to each other,
a diode having an anode connected to the first node and a cathode connected to a second node, the first node being between the transmission line and the input terminal, and
a capacitance element connected to the second node and a first power supply voltage, and
a charging/discharging circuit connected to a second power supply voltage and the first control terminal and charging and discharging the capacitance element from the second node in accordance with the first control signal such that when the first control signal is set to a first voltage, the charging/discharging circuit discharges the capacitance element, and the first switch cuts off connection between the antenna terminal and the input terminal, and when the first control signal is set to a second voltage, the charging/discharging circuit charges the capacitance element, and the first switch electrifies connection between the antenna terminal and the input terminal,
the charging/discharging circuit including a capacitance voltage control circuit and a current generation circuit,
wherein the capacitance voltage control circuit:
is connected to the cathode of the diode and the first control terminal, and
performs the charging of the capacitance element from the second node or drawing of a diode current from the second node and drawing of a discharge current of the capacitance element in accordance with the first control signal, and
wherein the current generation circuit is an open drain output circuit that generates a drawing current for performing the drawing.

7. The high-frequency switch circuit according to claim 6, wherein the capacitance voltage control circuit:
sets a potential of the second node to a potential lower than a potential of the first node and turns on the diode at the time of the drawing, and
sets the potential of the second node to a potential higher than the potential of the first node and turns off the diode at the time of charging of the capacitance element.

8. The high-frequency switch circuit according to claim 7, wherein the capacitance voltage control circuit has:
a second inductor element having one terminal connected to the cathode of the diode, and the other terminal connected to an output terminal of the current generation circuit, and
a second resistance element having one terminal connected to the second power supply voltage, and the other terminal connected to the other terminal of the second inductor element.

9. The high-frequency switch circuit according to claim 6, wherein the current generation circuit includes a transistor having a gate connected to the first control terminal, a drain connected to the output terminal, and a grounded source.

10. A front-end circuit comprising:
the high-frequency switch circuit according to claim 6;
a transmission signal amplifier connected to the input terminal of the high-frequency switch circuit, the transmission signal amplifier amplifying the transmission signal from the outside, and inputting the transmission signal to the high-frequency switch circuit; and
a reception signal amplifier connected to the output terminal of the high-frequency switch circuit, the reception signal amplifier amplifying the reception signal from the high-frequency switch circuit, and outputting the reception signal to the outside.

* * * * *